United States Patent
Boernert et al.

(10) Patent No.: US 10,073,160 B2
(45) Date of Patent: Sep. 11, 2018

(54) MAGNETIC RESONANCE IMAGING OF OBJECT IN MOTION

(75) Inventors: Peter Boernert, Hamburg (DE); Mariya Ivanova Doneva, Hamburg (DE); Christian Stehning, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1144 days.

(21) Appl. No.: 14/112,253

(22) PCT Filed: Apr. 11, 2012

(86) PCT No.: PCT/IB2012/051760
§ 371 (c)(1),
(2), (4) Date: Oct. 17, 2013

(87) PCT Pub. No.: WO2012/143821
PCT Pub. Date: Oct. 26, 2012

(65) Prior Publication Data
US 2014/0035582 A1  Feb. 6, 2014

(30) Foreign Application Priority Data

Apr. 21, 2011 (EP) .................................. 11163360

(51) Int. Cl.
| | |
|---|---|
| G01V 3/00 | (2006.01) |
| G01R 33/565 | (2006.01) |
| G01R 33/561 | (2006.01) |
| G01R 33/567 | (2006.01) |

(52) U.S. Cl.
CPC ........ *G01R 33/565* (2013.01); *G01R 33/5611* (2013.01); *G01R 33/5676* (2013.01); *G01R 33/56509* (2013.01); *G01R 33/5673* (2013.01)

(58) Field of Classification Search
CPC ............ G01R 33/4824; G01R 33/5611; G01R 33/561; G01R 33/5616; A61B 5/055
See application file for complete search history.

(56) References Cited

U.S. PATENT DOCUMENTS

| | | | | |
|---|---|---|---|---|
| 5,910,112 A | * | 6/1999 | Judd | ...................... A61B 5/055 324/318 |
| 7,688,068 B2 | | 3/2010 | Beatty | |
| 8,040,135 B1 | * | 10/2011 | Cukur | ................ G01R 33/5602 324/307 |

(Continued)

OTHER PUBLICATIONS

WO 2008/132659 A2, Egger, publication date: Nov. 6, 2008.*

(Continued)

*Primary Examiner* — Walter L Lindsay, Jr.
*Assistant Examiner* — Frederick Wenderoth

(57) ABSTRACT

A magnetic resonance imaging method includes acquisition of datasets of magnetic resonance data from an object. At least some of the datasets are undersampled in k-space. Each dataset relating to a motion state of the object. Images are reconstructed from each of the datasets by way of a compressed sensing reconstruction. Motion correction is applied to the reconstructed images relative to a selected motion state, so as to generate motion corrected images. A diagnostic image for the selected motion state is derived, e.g. by averaging from the motion corrected images.

16 Claims, 2 Drawing Sheets

(a)

(b)

(56) References Cited

U.S. PATENT DOCUMENTS

| | | | | |
|---|---|---|---|---|
| 2005/0100202 A1* | 5/2005 | Huang | ............... | G01R 33/5611 382/128 |
| 2008/0197842 A1* | 8/2008 | Lustig | .................. | G01R 33/561 324/307 |
| 2008/0240533 A1* | 10/2008 | Piron | ................... | G01R 33/482 382/131 |
| 2010/0189324 A1* | 7/2010 | Wollenweber | ........ | A61B 5/1114 382/131 |
| 2011/0175609 A1* | 7/2011 | Hu | ..................... | G01R 33/3415 324/309 |

OTHER PUBLICATIONS

Bhat et al "3D Projection Reconstruction Based Respiratory Motion Correction Technique for Free-Breathing Coronary MRA" Proc. Intl. Soc. Mag. Res. Med. 18 (2010) p. 669.

Jhooti et al "Phase Ordering With Automatic Window Selection (PAWS): A Novel Motion-Technique for 3D Coronary Imaging" Magnetic Resonance in Med. 43 p. 470-480 (2000).

Kim et al "Coronary Magnetic Resonance Angiography for the Detection of Coronary Stenosis" The New England Journal of Medicine, vol. 345, Dec. 27, 2001.

Chan et al "Multidimensional Golden Means for 3D-PR in Dynamic MRI" ISMRM Workshop Non Cart Imaging 2007.

Bhat, H., et al.; 3D Radial Sampling and 3D Affine Transform-based Respiratory Motion Correction Technique for Free-breathing Whole-Heart Coronary MRA with 100% Imaging Efficiency; 2011; MRM; 65:1269-1277.

Buerger, C., et al.; Undersampled Reconstruction of Multiple 3D High-Resolution Respiratory Phases Using Non-Rigid Registration; 2010; Proc. Intl. Soc. Mag. Reson. Med.; p. 3057.

Doneva, M., et al.; Improving Scan Efficiency of Respiratory Gated Imaging Using Compressed Sensing with 3D Cartesian Golden Angle Sampling; 2011; Proc. Intl. Soc. Mag. Reson. Med.; 19; 641.

Gamper, U., et al.; Compressed Sensing in Dynamic MRI; 2008; MRM; 59:365-373.

Jung, H., et al.; Radial k-t FOCUSS for High-Resolution Cardiac Cine MRI; 2010; MRM; 63:68-78.

Kellman, P., et al.; Fully Automatic, Retrospective Enhancement of Real-Time Acquired Cardiac Cine MR Images Using Image-Based Navigators and Respiratory Motion-Corrected Averaging; 2008; MRM; 59:771-778.

Kellman, P., et al.; High Spatial and Temporal Resolution Cardiac Cine MRI from Retrospective Reconstruction of Data Acquired in Real Time Using Motion Correction and Resorting; 2009; MRM; 62:1557-1564.

Kellman, P., et al.; Free-breathing, single shot fat-water separated cardiac imaging with motion corrected averaging; 2010; Proc. ISMRM; 18.

Lam, F., et al.; Compressed Sensing Reconstruction in the Presence of a Reference Image; 2010; Proc. Intl. Soc. Mag. Reson. Med.; p. 4861.

Lustig, M., et al.; Sparse MRI: The Application of Compressed Sensing for Rapid MR Imaging; 2007; MRM; 58:1182-1195.

Manke, D., et al.; Novel Prospective Respiratory Motion Correction Approach for Free-Breathing Coronary MR Angiography Using a Patient-Adapted Affine Motion Model; 2003; MRM; 50:122-131.

McConnell, M. V., et al.; Prospective adaptive navigator correction for breath-hold MR coronary angiography; 1997; MRM; 37(1)148-152.

Nehrke, K., et al.; Free-Breathing Whole-Heart Coronary MR Angiography on a Clinical Scanner in Four Minutes; 2006; J. MRI; 23:752-756.

Otazo, R. et al.; Combination of compressed sensing and parallel imaging with respiratory motion correction for highly-accelerated cardiac perfusion MRI; 2011; Journal of Cardiovascular Magnetic Resonance; 13(S1)098.

Prieto, C., et al.; 3D Undersampled Golden-Radial Phase Encoding for DCE-MRA Using Inherently Regularized Iterative SENSE; 2010; MRM; 64:514-526.

Sachs, T. S., et al.; Real-time motion detection in spiral MRI using navigators; 1994; MRM; 32(5)639-645.

Schirra, C. O., et al.; Toward True 3D Visualization of Active Catheters Using Compressed Sensing; 2009; MRM; 62(2)341-347.

Stehning, C., et al.; Free breathing 3D balanced FFE coronary magnetic resonance angiography with prolonged cardiac acquisition windows and intra-RR motion correction; 2005; MRM; 53(3)719-723.

Sundaresan, R., et al.; Motion-Compensated Compressed Sensing for Dynamic Imaging; 2010; Proc. SPIE; 7798:77980A-77980A-8.

Timinger, H., et al.; Motion compensation for interventional navigation on 3D static roadmaps based on a dynamic motion model; 2004; International Congress Series; 1268:1055-1060.

Weber, O. M., et al.; Whole-heart steady-state free precession coronary artery magnetic resonance angiography; 2003; MRM; 50(6)1223-1228.

Winkelmann, S., et al.; An Optimal Radial Profile Order Based on the Golden Ratio for Time-Resolved MRI; 2007; IEEE Trans. on Medical Imaging; 26(1)68-76.

Wu, B., et al.; An improved approach in applying compressed sensing in parallel MR imaging; 2009; Proc. Intl. Soc. Mag. Reson. Med.; 17:4595.

\* cited by examiner

MAGNETIC RESONANCE IMAGING OF OBJECT IN MOTION

FIELD OF THE INVENTION

The invention pertains to magnetic resonance imaging method in which magnetic resonance datasets are acquired from an object in motion. Further, the datasets are undersampled and reconstruction is performed by way of compressed sensing.

BACKGROUND OF THE INVENTION

Such a magnetic resonance imaging method is known from the paper Compressed sensing in dynamic MRI' by U. Gamper et al. in MRM 59(2008)365-373.

The known magnetic resonance imaging method relates to cardiac MR imaging in which sparsely sampled datasets are acquired for each heart phase. Then on the basis of compressed sensing images are reconstructed for each heart phase. Each heart phase has the same number of sampling points and the sampling points (in the k-t space) should be closely separated.

SUMMARY OF THE INVENTION

An object of the invention is to provide an magnetic resonance imaging method that improves the signal-to-noise ratio (SNR) of a diagnostic image that is based on undersampled magnetic resonance datasets.

This object is achieved by a magnetic resonance imaging method according to the invention which includes
- acquisition of datasets of magnetic resonance data from an object
- at least some of the datasets being undersampled in k-space
- each dataset relating to a motion state of the object,
- reconstruction of images from each of the datasets by way of a compressed sensing reconstruction,
- application of a motion correction to the reconstructed images relative to a selected motion state, so as to generate motion corrected images and
- derivation of a diagnostic image for the selected motion state from the motion corrected images.

The problem of reconstruction of images from sparse or undersampled datasets that involve undersampling of k-space is solved by employing compressed sensing. Notably, the image quality of each of the reconstructed images may be different because the degree of undersampling and the details of incomplete k-space coverage may be different. These differences, and differences in SNR of these images are compensated by motion correction and by using the information of all motion corrected images in the diagnostic image. This leads to a diagnostic image that has a high SNR and low level of image artefacts. A simple and yet effective manner is to form the diagnostic image as the average of the motion corrected images. Thus, no data are rejected, efficiency is improved and SNR is maximised.

In one aspect of the invention, there is one dataset that has full k-space sampling and thus contains in essence all image information so that e.g. the image from the fully sampled dataset can be reconstructed by Fast Fourier Transformation (FFT). The image information from the FFT reconstructed image is then used as a priori information in the compressed sensing reconstruction of the images for the undersampled datasets.

In another aspect of the invention, correlations between the images for different motion states are used as a priori information for the compressed sensing reconstruction. Notably, the correlations are derived from prior knowledge on the type of motion of the object. Notably, this implementation is well suited apply when periodic motion occurs. Good results are achieved when the motion is smooth, such as for example in respiratory motion of a patient to be examined.

In a further aspect of the invention an affine 3D translation with linear transform motion correction method is applied. Such a motion correction very accurately corrects for respiratory motion.

The invention also relates to a magnetic resonance examination system that on the basis of magnetic resonance datasets, of which several are undersampled, produces a diagnostic image that has a high SNR and low level of image artefacts. The invention further relates to a computer program. The computer program can be provided on a data carrier such as a CD-rom disk or a USB memory stick, or the computer program can be downloaded from a data network such as the world-wide web. When installed in the computer included in a magnetic resonance imaging system the magnetic resonance imaging system is enabled to operate according to the invention and achieves on the basis of magnetic resonance datasets, of which several are undersampled to produce a diagnostic image that has a high SNR and low level of image artefacts.

DETAILED DESCRIPTION OF THE EMBODIMENTS

Figure 1:
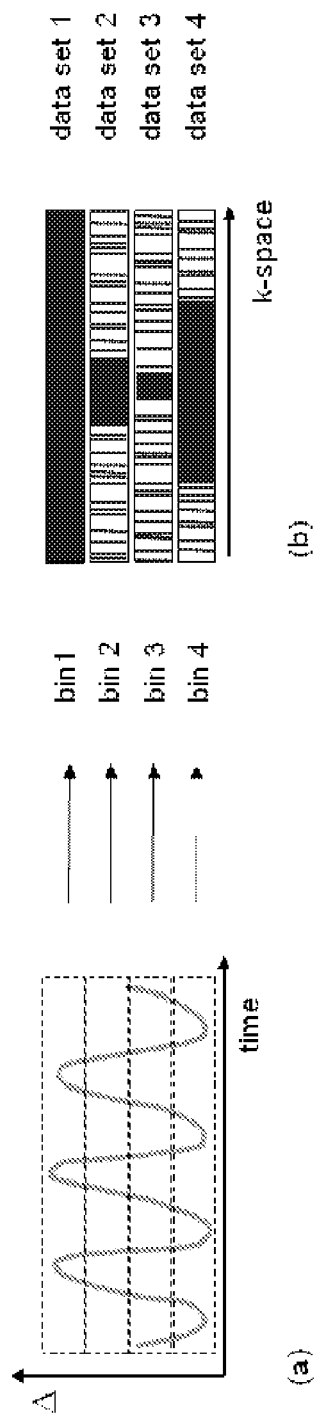
FIG. 1. shows a PAWS gating scheme.

FIG. 1. shows a phase ordered with automatic window selection (PAWS) gating scheme in which (a) the respiration navigator signal (FIG. 1a) that measures the right hemi-diaphragm displacement over time is used to decide which bin will be filled in time. Using an appropriate sampling scheme at the end of the scan (b) k-space is filled in a variable density random fashion. Using an appropriate k-space sampling scheme, in the bins containing the incomplete data sets an incoherent data distribution is realised, with the central k-space part sampled completely. This allows reconstruction of all the data in all bins via compressed sensing (CS) [8]. The individual images can be motion-corrected and averaged to improve SNR. Additionally also the correlation among the individual images (bins), which reflect slightly different motion states, can be used to improve CS reconstruction. In this approach a certain motion model (affine: 3D translation+linear transform [rotation, stretching] described by 12 parameters [9] or more sophisticated ones) can be incorporated into the CS reconstruction. The objective in choosing k-space sampling scheme is to achieve quasi-random quasi-isotropic k-space coverage in all bins with incomplete k-space coverage.

One potential sampling pattern can be achieved by means of Golden ratio profile ordering. Golden ratio has been previously used in radial sampling [10,11] to achieve quasi-isotropic k-space coverage over the total duration of the scan as well as for an arbitrary time window extracted from a scan for dynamic imaging. However, Golden ratio can also be used to determine the profile ordering in Cartesian sampling by choosing the point on the Cartesian grid lying closest to the coordinates determined by the Golden ratio.

Figure 3:
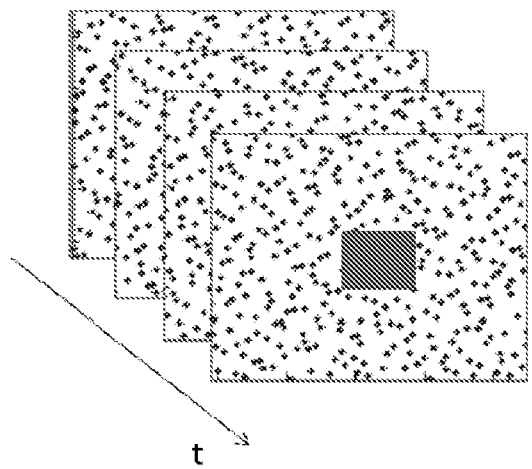
FIG. 3 illustrates randomized k-t sampling.

FIG. 3 illustrates randomized k-t sampling. Full sampling of the k-space centre is performed in the beginning followed by incoherent k-t sampling. Random sampling, Golden ratio, Poisson disk sampling or Halton sampling are possible choices for the sampling pattern in k-t space.

Alternatively, initial estimation of the period duration of respiratory motion can be used to determine the k-space sampling to achieve the desired k-space coverage. This can be achieved by performing the sampling in several time frames with randomized undersampling in k-space and along the temporal direction (FIG. 3).

Several possible choices for the randomized k-t trajectory include random sampling, Poisson disk sampling, Halton sequence and Golden ratio. Initial sampling of a fully sampled k-space centre followed by centre-out acquisition of the randomized trajectory in each frame might be appropriate.

At the end of the acquisition, one of the bins (e.g. bin 1 in FIG. 1b) is fully sampled and all the others (e.g., bins 2, 3, and 4) are undersampled. The reconstruction is performed for instance by solving for each bin the optimization problem:

$$\text{Min } \Sigma_i \|F_{ui}x_i - y_i\|_2 + \|\Psi x_i\|_1$$

Where $F_{ui}$ is the undersampled Fourier transform operator for bin i, $x_i$ is the image $y_i$ is the measurement vector and is the sparsifying transform (e.g. wavelets or finite differences). Another possibility is to use the fully sampled image in the l1 term $$\text{Min} \Sigma_i \|F_{ui}x_i y_i\|_2 + \|\Psi(x_i - x_c)\|_1$$

to achieve higher sparsity.

The images reconstructed in this way can be used to estimate the transformation matrices $A_i$ (translation, rotation) for each bin relative to the fully sampled bin. These matrices can be used in a second step to further improve the image quality by adding the self consistency term $$\text{Min} \Sigma_i \|F_{ui}x_i - y_i\|_2 + \|\Psi(x_i - x_c)\|_1 + \|A_i x_i - x_c\|_2$$

The approach can be combined with parallel imaging and can additionally be undersampled in the CS sense. No data are rejected, efficiency is improved and SNR is maximised.

EXAMPLE NO (I)

Figure 2:
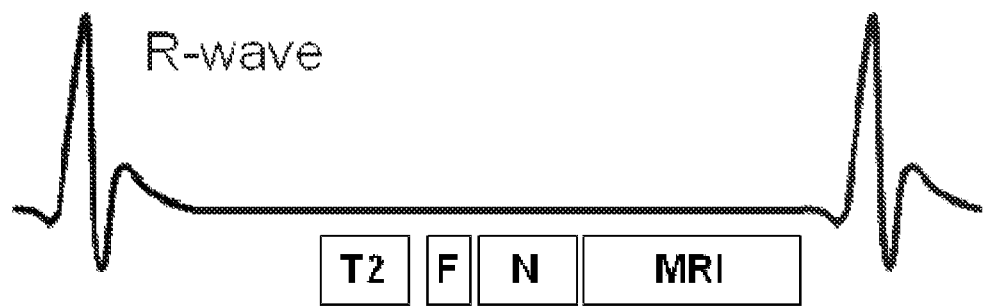
FIG. 2. shows a scheme of a 3D magnetization prepared (T2-prep+fat suppressed) navigator (N) gated coronary angiography scan.

FIG. 2. shows a scheme of a 3D magnetization prepared (T2-prep+fat suppressed) navigator (N) gated coronary angiography scan. A standard whole heart Cartesian CMR protocol is used [1]. It includes navigator gating, EKG triggering, magnetization preparation and TFE signal detection. A $T_2$ preparation sequence (T2) is employed to improve the contrast between blood and myocardium, and fat signal pre-saturation (F) is used to suppress the epi-cardial fat that is embedding the coronary vessels (see FIG. 2). A PAWS like gating scheme is used as shown in FIG. 1. The bin width is set to an acceptable value of 5 mm to freeze respiratory motion. As an option the most probable motion state is estimated just before the scan by acquiring some navigator value statistics. This motion state can optionally be used as a reference for prospective tracking. During the acquisition the navigator signal (N) is evaluated and it is decided prospectively to which bin the data measured next will belong. Alternatively, motion can be estimated on the basis of the CS-reconstructed undersampled data sets, where the CS reconstruction has been shown to provide sufficient image quality for an imaged-based motion detection, making additional navigators superfluous.

A special k-space sampling scheme is defined, with some emphasis to fill the central part of k-space for each bin first. In the outer part of k-space random or Poisson disk sampling is performed. The temporal order of this sampling order is influenced by the ideas of golden section sampling to ensure that at the time of scan termination for each bin that might be filled differently (number of profiles wise) a incoherent sample distribution can be realized allowing for CS reconstruction. The scan is terminated if one bin is completely filled. CS based image reconstruction is performed either for each bin individually followed by appropriate registration and image combination or by a more accurate joint CS approach incorporating a potential model in the reconstruction process.

EXAMPLE NO (II)

A standard whole heart Cartesian CMR protocol is used [1], but in this protocol the sampling during the R-R interval was increased by using two or three individual sampling segments each belonging to a separate CMRA data set. An acquisition like this was proposed by Stehning et al.[12] for a radial (stack-of-stars) approach, but here a Cartesian sampling with variable density random sampling is proposed. In this approach for each 3D data the same number of total profiles are acquired, but less than necessary to fulfil the Nyquist sampling criteria, but the distribution in k-space differs for the three data sets. After acquisition of a predefined number of profiles sampling is terminated and CS image reconstruction is performed. The motion induced relationship among all these three individual data sets is used in the CS reconstruction. This example is also useful in other anatomies, where motion cannot easily be assed prospectively, such as involuntary head motion in brain scans.

EXAMPLE NO (III)

A combination of the sampling approach described in example (I) and (II).

This approach is applicable to cardiac MRI especially in coronary MR angiography (CMRA), but is applicable in other anatomies as well. Examples include 3D abdominal free breathing applications, or high resolution brain imaging, where patient groups are subject to involuntary head motion.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

REFERENCES

[1] Kim et al. NEJM 2001; 27; 345:1863.
[2] Weber et al. MRM 2003; 50:1223.
[3] Nehrke et al. JMRI 2006; 23:752.
[4] Sachs T S, et al., MRM 1994; 32, 639-45.
[5] McConnell M V, et al. MRM. 1997; 37: 148-52.
[6] Jhooti P, et al. MRM. 2000; 43:470-80.
[7] Bhat, et al. ISMRM 2010; #669
[8] Lustig M, et al. MRM 2007; 58:1182-95.
[9] Manke et al. MRM 2003; 50:122-131.

[10] Winkelmann S et al, IEEE Trans Med Imag 26:68-76
[11] Chan R et al ISMRM Workshop Non Cart Imaging 2007
[12] Stehning C, et al. MRM 2005; 53:719-23.

The invention claimed is:

1. A magnetic resonance imaging method including acquisition of datasets in bins of magnetic resonance data from an object,
    applying a respiratory navigator to decide which bins to be filled in time so that each binned dataset relates to a motion state of the object,
    at least some of the datasets being undersampled in k-space in a defined, bin-specific manner by way of an appropriate –k-space sampling scheme such that some of the bins contain incomplete data, a complete sampling of the centre of k-space is obtained, and k-space is sampled in a variable density random fashion,
    each dataset relating to a motion state of the object,
    reconstruction of images from the magnetic resonance data in each of the bins of datasets by way of a compressed sensing reconstruction,
    application of a motion correction to the reconstructed images relative to a selected motion state, so as to generate motion corrected images and
    derivation of a diagnostic image for the selected motion state from the motion corrected images.

2. The magnetic resonance imaging method as claimed in claim 1, wherein one of the datasets is fully sampled and the image reconstructed from the fully sampled dataset is used as a priori information in the compressed sensing reconstruction.

3. The magnetic resonance image as claimed in claim 1, wherein correlations between the datasets is used as a priori information in the compressed sensing reconstruction.

4. The magnetic resonance imaging method as claimed in claim 1, wherein a quasi random sampling of k-space is employed to form the undersampled datasets.

5. The magnetic resonance imaging method as claimed in claim 4, wherein an estimate of the object's motion is made and the k-space sampling coverage is controlled on the basis of the estimated motion.

6. The magnetic resonance imaging method as claimed in claim 1, wherein the diagnostic image for the selected motion state is formed by averaging of the motion corrected images.

7. A non-transitory computer-readable medium carrying instructions for controlling one or more computer processors to perform the method as claimed in claim 1.

8. A magnetic resonance examination system configured for acquisition of datasets in bins of magnetic resonance data from an object
    application of a respiratory navigator to decide which bins to be filled in time so that each binned dataset relates to a motion state of the object,
    at least some of the datasets being undersampled in k-space in a defined, bin-specific manner by way of an appropriate k-space sampling scheme such that some of the bins contain incomplete data, a complete sampling of the centre of k-space is obtained, and k-space is sampled in a variable density random fashion,
    each dataset relating to a motion state of the object,
    reconstruction of images the magnetic resonance date in from each of the bins of datasets by way of a compressed sensing reconstruction,
    application of motion correction to the reconstructed images relative to a selected motion state, so as to generate motion corrected images and
    derivation of a diagnostic image for the selected motion state from the motion corrected images.

9. A magnetic resonance (MR) examination system comprising:
    a display device;
    one or more computer processors configured to:
        control a magnetic resonance imaging scanner to apply a magnetic resonance navigator for estimating an object's motion,
        acquire magnetic resonance data sets from the object, the acquisition of the magnetic resonance data sets including controlling k-space sampling coverage based on the estimated motion wherein at least one of the magnetic resonance data sets is fully sampled in k-space and other data sets are quasi random sampled in k-space and are undersampled in a variable density fashion,
        sort the magnetic resonance data into bins based on the estimate of the object's motion, each bin relating to a corresponding motion state of the object,
        reconstruct images from the magnetic resonance data sets in each of the bins using a compressed sensing (CS) algorithm, the image from the fully sampled data set being used as a priori information in the compressed sensing algorithm during reconstruction of the undersampled data sets,
        motion correct the reconstructed images to a common motion state to form motion corrected images based on the magnetic resonance navigator,
        combine the motion corrected images into a diagnostic image, and
        control the display device to display the diagnostic image.

10. The system as claimed in claim 9, further including:
    a magnetic resonance imaging scanner controlled by the one or more computer processors.

11. The magnetic resonance examination system as claimed in claim 9, wherein combining the motion corrected images includes averaging the motion corrected images.

12. The magnetic resonance examination system as claimed in claim 9, wherein the one or more computer processors are further configured to control the magnetic resonance imaging scanner to apply a k-space imaging pattern achieved by means of Golden ratio profile ordering.

13. The magnetic resonance examination system as claimed in claim 12, wherein the one or more computer processors are further programmed to control the k-space sampling pattern to perform radial sampling.

14. The magnetic resonance examination system as claimed in claim 12, wherein the one or more computer processors are further programmed to control the k-space sampling pattern to perform Cartesian sampling by choosing a point in a Cartesian grid lying closest to coordinates determined by the Golden ratio.

15. The magnetic resonance examination system as claimed in claim 12, wherein the one or more computer processors are further programmed to control the k-space sampling pattern such that at a time of scan termination, each bin is filled differently with an incoherent sample distribution.

16. The magnetic resonance examination system as claimed in claim 9, wherein the object includes a heart of a human patient and the diagnostic image is a 3D coronary magnetic resonance angiographic image.

* * * * *